United States Patent [19]
Romankiw et al.

[11] 3,972,595
[45] Aug. 3, 1976

[54] FERROFLUID DISPLAY DEVICE

[75] Inventors: Lubomyr T. Romankiw, Briarcliff Manor, N.Y.; Marko M. G. Slusarczuk, Boston, Mass.; David A. Thompson, Somers, N.Y.

[73] Assignee: International Business Machines Corporation, Armonk, N.Y.

[22] Filed: Jan. 27, 1975

[21] Appl. No.: 544,593

[52] U.S. Cl................................ 350/267; 340/373
[51] Int. Cl.²......................................... G05D 25/00
[58] Field of Search................. 350/267; 340/324 R, 340/336, 373, 378 R

[56] References Cited
UNITED STATES PATENTS

| | | | |
|---|---|---|---|
| 3,648,269 | 3/1972 | Rosensweig | 350/267 X |
| 3,863,249 | 1/1975 | Olah | 340/373 |

*Primary Examiner*—John K. Corbin
*Assistant Examiner*—F. L. Evans
*Attorney, Agent, or Firm*—Graham S. Jones, II

[57] ABSTRACT

A magnetizable fluid which serves as a display liquid and which includes a suspension of colloidal magnetic particles is used in a display device. The magnetic fluid is opaque to provide optical contrast. A host liquid is substantially immiscible with the display liquid. The display liquid is carried in a reservoir section which is distributed about the periphery of a display field in the reservoir. Each propagation line of the display field is provided with a bubble generator, which passes bubbles by the input end of each line. A bubble switch coil draws selected bubbles across a gap to reach the associated propagation line in response to a signal impressed on the coil. A uniform rotating magnetic field is provided by a permanent magnet beneath the display or by orthogonal magnetic coils.

9 Claims, 17 Drawing Figures

FERROFLUID DISPLAY DEVICE

FIELD OF THE INVENTION

This invention relates to display devices and more particularly to ferrofluid display devices employing two substantially immiscible liquids for display purposes.

DESCRIPTION OF THE PRIOR ART

A ferrofluid is a colloidal suspension of submicron sized magnetic particles in a carrier fluid (Rosensweig R. E., "Magnetic Fluids," International Science and Technology, July 1966, pp. 48–56). The outstanding characteristic of a ferrofluid is that it exhibits both magnetic and fluid properties. This characteristic is unique, since all natural fluids are either paramagnetic or diamagnetic, not superparamagnetic thereby not exhibiting strong magnetic characteristics.

In a colloidal suspension, particles are attracted due to Van der Waals force. This force varies as the inverse sixth power of their separation, and for equal sized particles is equivalent to the thermal energy, kT, when the surfaces are separated by one sphere radius. Thus, to successfully keep a colloidal suspension from flocculating, individual particles must be sufficiently separated. This is accomplished either by creating a condition under which the particles are electrically charged or by the addition of a surfactant or dispersing agent such as oleic acid or both. The oleic acid molecules attach themselves to the individual magnetite particles forming a layer about 20A to 35A thick. When two particles, coated in this manner with oleic acid approach each other even if only slightly charged, it is believed that the compression of the coating provides an elastic repulsion preventing the two particles from approaching closely enough for the magnetic field to cause flocculation.

To form a very stable colloidal suspension, particles can be made to carry a relatively large electrical charge. When the charge is large enough and the particles very small, they remain suspended indefinitely by the mechanism of Brownian motion. This also holds true for particles of magnetic materials such as magnetite, but there, in addition to Van der Waals force discussed above, another factor must be considered, particularly when the colloidal suspension is placed in a magnetic field. When such a magnetic colloid is placed in a magnetic field, each magnetic particle forms a dipole. Such dipoles chain up, resulting in a sufficiently large mass of magnetic material to attract more particles. The Brownian motion and electrical charge on the particles alone, although often sufficient to prevent flocculation in a nonmagnetic colloid, are insufficient to prevent these particles from agglomerating and precipitating from the solution. Since the magnetic energy of uniformly magnetized tangent spheres is proportional to the square of the magnetization and the cube of the particle radius, by making the particles small enough and adsorbing on them a long chain hydrocarbon surfactant such as oleic acid, the effective radius of each of the particles is increased to the point that the magnetic field interaction between the particles becomes small and consequently, the electrical charge and the thermal agitation energy kT become sufficiently large to overcome the magnetic effect. This holds true if the magnetite particles are 25–200A in diameter.

Ferrofluids have been prepared commercially incorporating a wide variety of carrier fluids and dispersing agents. Some of the more commonly available carriers are water, hydrocarbons, fluorocarbons, esters, diesters. The magnetic saturation moment, carrier fluid and the dispersing agent are the main factors which determine the chemical and magnetic properties of the ferrofluid. Commercially available ferrofluids are specified by carrier fluid and the magnetic saturation moment. However, the dispersing agents are not generally specified. This can result in presumably the "same" kind of fluid manufactured by two different processes or manufacturers, having vastly differing fluid properties and stabilities in particular when they are contacted with a solid surface or with a (transparent) host fluid.

Some interesting phenomena observed when a ferrofluid interacts with a magnetic field are presented in Kaiser R. and Miskolczy G., "Some Applications of Ferrofluid Magnetic Colloids," IEEE Transactions on Magnetics, vol. MAG-6, no. 3, September 1970, pp. 694–698. They include as follows:
1. suspension by the application of a magnetic field,
2. stable levitation of an object by application of a magnetic field,
3. variable apparent specific gravity that is controlled by an applied magnetic field,
4. generation of a fluid motion by thermal or magnetic means without any moving mechanical parts,
5. ability to flow and to conduct magnetic flux, and
6. spontaneous formation of stable liquid spikes in the presence of perpendicular magnetic fields.

On the basis of these peculiar properties, several interesting uses for these fluids have been developed. Some of the ones which have recently appeared in literature are: ferrofluid gyroscope (Miskolczy G. and Little R., "Ferrofluid Gyro," Technical Report AFFDL-TR-71--179, November 1971), magnetic fluid seals (Rosensweig R. E., Miskolczy G., and Ezekiel R. D., "Magnetic-Fluid Seals," machine Design, Mar. 28, 1968), energy conversion methods (Rosensweig R. E., Nestor J. W., and Timmins R. S., "Ferrohydrodynamic Fluids for Direct Conversion of Heat Energy," Proceedings A.I.Ch.E.—I. Chem. E. Joint Meeting [London], June 1965, pp. 95–110 and Van Der Voort E., "Ideal Magnetocaloric Conversion," Appl. Sci. Res. 20, February 1969), oil spill cleanup (Kaiser R., Miskolczy G., Curtis R. A., Colton C. K., "The Recovery of Oil from Water with Magnetic Liquids," Proc. of Joint Conf. on Prevention and Control of Oil Spills, June 15-17, 1971), inkjet printing (Ferrofluidics Corp., "Magnetic Fluids Application Sketches"). Uses of ferrofluids in display technology have also been suggested in the latter reference, and Romankiw, Slusarczuk, and Thompson discuss a method in accordance with this invention by which this can be accomplished (Romankiw, L. T., Slusarczuk M. M. G., and Thompson D. A., "Liquid Magnetic Bubbles," Paper 32-6 INTERMAG 1974, published at pp. 25–28 in the January 1975 issue IEEE Trans. Mag.).

U.S. Pat. No. 3,648,269 of Rosensweig et al. shows a transparent fluid and an opaque magnetic fluid which are immiscible contained within a glass sandwich with a magnetic array below for creating magnetic fields for acting upon the magnetic fluid. The magnets of the array can be turned on to collect all of the magnetic fluid in certain places and certain configurations to create fixed visual displays. No display of the T.V., CRT or moving billboard variety comprised of a plurality of droplets translated by a rotating field or the like is suggested. Further, no means of emitting droplets or switching of droplets is suggested. The use of a surfactant in the form of oleic acid is specifically taught as is the use of fluorocarbons (FREON*) and hydrocarbons (kerosene). A magnetic imprint on a moving magnetic tape is suggested. The patent also states at Col. 2., lines 24–29, "By using electromagnets and/or the fields surrounding current carrying wires, the pattern may be controlled either by motion of the magnetic field source or by switching the currents or a combination of the two. Alphanumeric displays may also be created." The idea of emitting droplets onto a screen-like display where they can be translated across or down the screen or returned to the reservoir by means of a switch is not taught.

An article entitled "Magnetic Bubble Domain Display," by D. B. Dove et al., IBM Technical Disclosure Bulletin, Vol. 17, No. 4, September 1974, pp. 1045–1046 describes a display which involves a magnetic bubble domain device incorporating amorphous material, in which magnetic bubble domains are present in an amorphous material. Then ferrofluid material is caused by the magnetic bubble domains to concentrate above the domains to "stain" them. It is suggested that a ferrofluid can be suspended in water to stain the magnetic bubble domains. Permalloy elements on the wafer such as T- and I-bars are used to move the magnetic bubble domains which carry the ferrofluid material. No suggestion was made that the device could be made without inclusion of amorphous or other magnetic bubble domain material. No technique was suggested for storing the ferrofluid, ferrofluid bubble generation, ferrofluid bubble selection, annihilation and recirculation.

In the scheme, in accordance with this invention, discussed by Romankiw, Slusarczuk, and Thompson, the ferrofluid is placed between two glass plates. When a magnetic field is applied perpendicular to the two glass plates, a lare scale analog of magnetic bubble domain behavior (Bobeck, A. H., and Scovile, H. E. D., "Magnetic Bubbles," Scientific American) can be achieved. In the scheme discussed by Romankiw, Slusarczuk, and Thompson, permalloy T- and I-bars are deposited on one of the glass plates to permit stepwise controlled bubble propagation. Thus, motion of the ferrofluid is achieved in an analogous manner as domain motion is achieved in the case of bubble domain devices made using orthoferrite, garnet, or amorphous materials. Namely, by the use of a vertical bias field and of a rotating in-plane horizontal field, magnetic poles are induced in a T and I bar permalloy overlay. Fluid magnetic droplets follow these poles along the pattern. Since the ferrofluid is a totally nontransparent black liquid, a shift register type display can be implemented. When droplets of $\approx 10$ to $\approx 100$ mil in size are used, the patterns are visible to the naked eye with ambient lighting being sufficient to observe the patterns. A switch at the generator of the shift register selects whether to enter the droplet of the ferrofluid into the shift register or to leave that location void. Thus, the image is shifted in, left at the viewing area for a certain duration of time, and then shifted out while a new one is shifted in.

One of the parameters of interest in designing a display is the rate at which the images can be changed. In the ferrofluid display, this corresponds directly to the speed with which a droplet in a host can track a moving magnetic field. A multitude of factors affect the velocity of propagation, which include viscosity of the host fluid, interfacial tension, friction between the propagating liquid bubble and the walls of the container, ease of preferential wetting of the surfaces by the host fluid, magnetic moment of the ferrofluid, and the strength of the magnetic field.

SUMMARY OF THE INVENTION

A display device includes a first fluid and a second fluid substantially immiscible with the first fluid. The first fluid carries many magnetic particles which cannot move across the interface between the two fluids. Means are provided for emitting separate droplets of one of the fluids from a first space into a second space. Magnetic means provide for propagating motion of the droplets from the means for emitting along a desired path in the second space.

In another aspect of this invention, a display apparatus employs fluid droplets to represent data. It includes a carrier fluid host and a magnetic fluid or a magnetic fluid host and a nonmagnetic propagating fluid. The fluids possess contrasting optical properties and are immiscible. One of the fluids includes magnetic particles which allow it to be translated through space in response to a magnetic field. Included in the structure are an array of display rows, a reservoir of one of the fluids, an array of means for emitting droplets of the one fluid from the reservoir into proximity to an associated one of the display rows. Each display row includes a magnetic structure for providing a propagation path for emitted droplets and a rotating magnetic field for magnetizing the magnetic structure to produce droplet translation. Preferably, switching means is included for selecting droplets for passage from said means for emitting to one of the display rows in response to a predetermined condition signal and passage elsewhere in the absence of said predetermined condition signal.

DESCRIPTION OF THE PREFERRED EMBODIMENT

Magnetized fluid located between two surfaces in an enclosure is used for a high contrast display.

A ferrofluid is a "magnetic fluid" colloidal suspension of submicron size magnetic particles in a carrier fluid. The magnetic particles are preferably separated by use of a surfactant (coating material havin the property of preventing particles from sticking together) such as oleic acid, i.e., a ferrofluid. When a ferrofluid is immersed in a nonmagnetic host liquid, with which it is immiscible, the ferrofluid forms a spherical droplet. The droplet can be moved in response to an applied magnetic field. There is mutual repulsion between bubbles when a perpendicular field is applied.

A display can be provided by placing the ferrofluid in a transparent host liquid sandwiched between two transparent plates 60, 61 (FIG. 3B) (or at least plate 60). When a magnetic field is applied to the device, a large scale analog of magetic domain behavior is achieved.

Suitable fluids for a ferrofluid are water, FREON* fluorocarbon, TF, kerosene, etc. Magnetite can be used as the magnetic material coated with the oleic acid used as the surfactant or dispersing agent.

Figure 2:
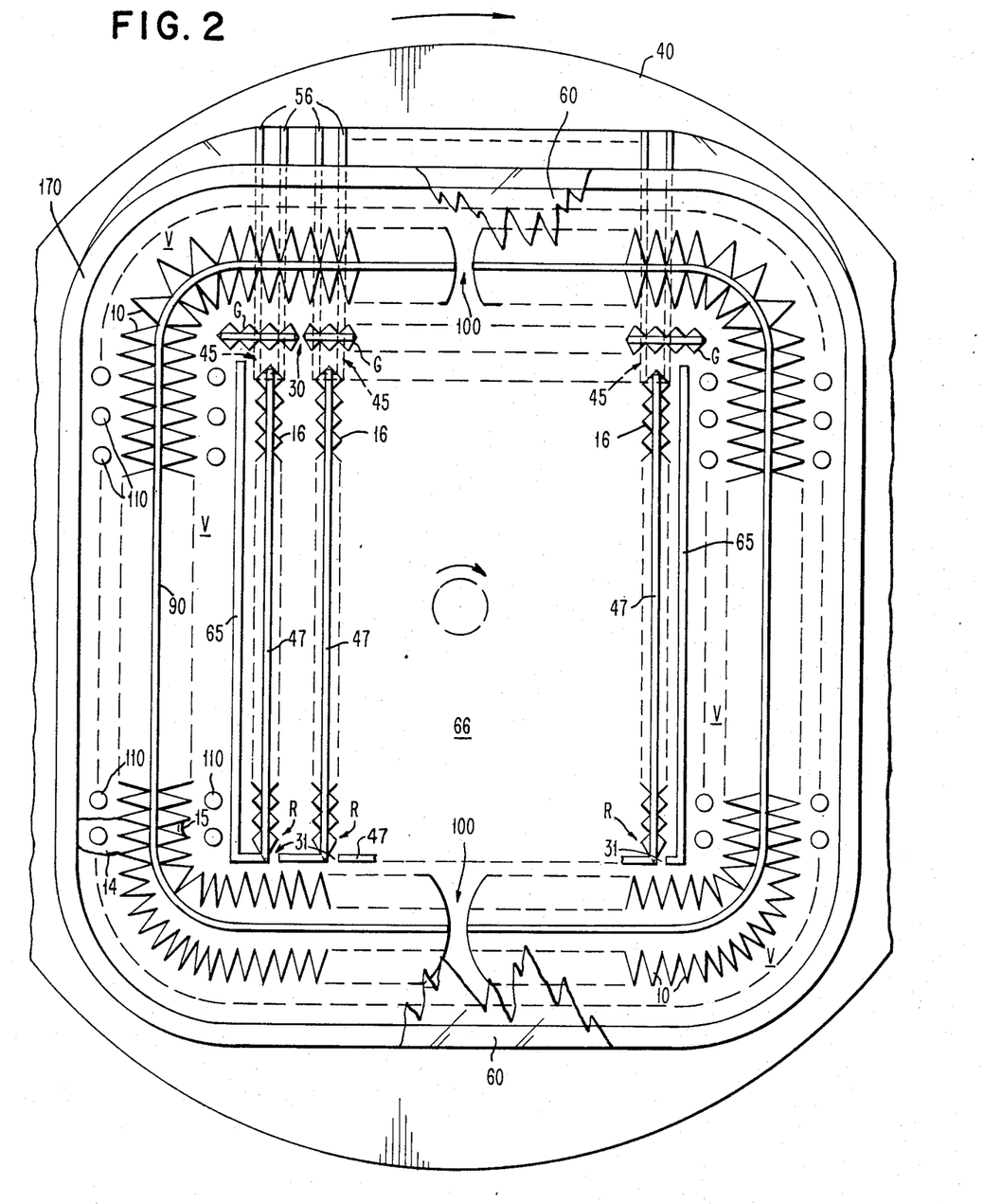
FIG. 2 is a more detailed embodiment of the display unit of FIG. 1.

The moving display can be provided by emitting or generating droplets from a plurality of parallel generators and then passing them onto a shift register or back to a reservoir, each line under the control of a switch. An external rotating magnetic field and a suitable structure of permeable members can move the droplets down or across the display. Rotating permanent magnet 40 (driven by a stepping motor controlled by a data source) shown in FIGS. 2 and 3B provides uniform magnetic field within the display unit.

Magnetized fluid located between two surfaces may be used for noncontact testing and high-contrast display. The magnetized fluid is comprised of droplets of magnetic liquid in an immiscible nonmagnetic host fluid.

Fluid magnetic bubbles have many of the properties of magnetic bubble domains. Their shape is determined by an interplay of forces, in which surface tension plays the role of domain wall energy for the magnetic bubble domain situation. Since the amount of liquid bubble material is fixed, unlike magnetic bubble domains which can be expanded without limit a liquid bubble generator or annihilator must generally have a fluid reservoir. In other respects, the liquid bubbles can be moved around in the same manner as magnetic bubble domains are moved around; that is, by current loops, permalloy overlays, etc.

High-Contrast Display

Liquid bubble domains for displays have several advantageous features among whch is the large spot size range that is available. The liquid bubbles can be produced from a few mils in diameter to about a hundred mils. Interfacial tension, saturation moment, propagating pattern interval, shape, size and thickness and plate spacing can be varied to obtain the desired bubble size. The plates can be ordinary window glass so that magnetic liquid displays are potentially low cost. No expensive single crystals, projection screens, or vacuum seals ae required to limit the size which is practical.

Another advantage to liquid bubble displays is that of optical efficiency, which is nearly 100%. As an example, a water-base ferrofluid in a host liquid of kerosene and FREON* fluorocarbon mixture offers a very large optical contrast. The ferrofluid is opaque for spacings as small as 1 mil, and the host fluid is optically transparent.

*FREON is a trademark of the DuPont Company.

Another advantage of liquid bubble displays is that it is possible to detect the presence of a liquid bubble by all of the magnetic means used for detection of magnetic bubble domains. However, complicated and sensitive equipment is not required, since the liquid bubbles can be detected directly if one liquid is made conducting and the other fluid is an insulator.

In general, it is assumed that the liquid bubble fluid is magnetic while the host is nonmagnetic. The opposite situation works equally well, except that the bubbles then move in the opposite direction in the field gradient. In a display application, the latter may be a preferred situation so that clear, nonmagnetic liquid bubbles move in an opaque, magnetic host fluid.

Usually, the liquid magnetic bubbles can be generated by using bubble splitting techniques commonly used for magnetic bubble domains, by mechanical chopping, by injecting a thin stream into a field gradient to form the bubbles from the resulting fluid instability, or by the action of a rotating in-plane field upon the labyrinth configuration, including excitation at frequencies which cause mechanical resonances within the bubbles.

The type of ferrofluid display involved here uses substantially immiscible magnetic and nonmagnetic liquids, one of which liquids is pigmented with respect to the other located between two surfaces along with a bubble generating structure and bubble manipulating structures to form a visual display, by moving bubbles into desired places in a matrix, when desired. A magnetic field can be perpendicular to a ferrofluid magnetic bubble display to polarize the bubbles magnetically, analogously to use in magnetic bubble domain devices, including propagation methods. This is expensive and produces magnetic field interference with adjacent unrelated equipment.

However, liquid magnetic bubbles can also be propagated without a perpendicular magnetic field, using only an in-plane magnetic field rotating at half the speed needed in the conventional bubble domain case for a given number of unit cell propagations per second.

In conventional bubble domain devices, the perpendicular bias field is essential because the cylindrical domain structure is not stable in its absence. For similar stability reasons, magnetic bubble domains are always magnetized perpendicular to the surface of the crystal, and the propagation structure is designed with this fact in mind. Liquid bubbles do not suffer from this limitation. When one chooses to utilize a perpendicular bias field, then liquid bubble behavior becomes analogous to bubble domain behavior, and one can use the extensive repertoire of propagation structures known for bubble domains. (Bobeck and Scovil, op. cit.) But one can also devise liquid bubble propagation structures to be described which do not require the perpendicular bias field. For simplicity and economy these constitute a preferred embodiment.

Figure 1:
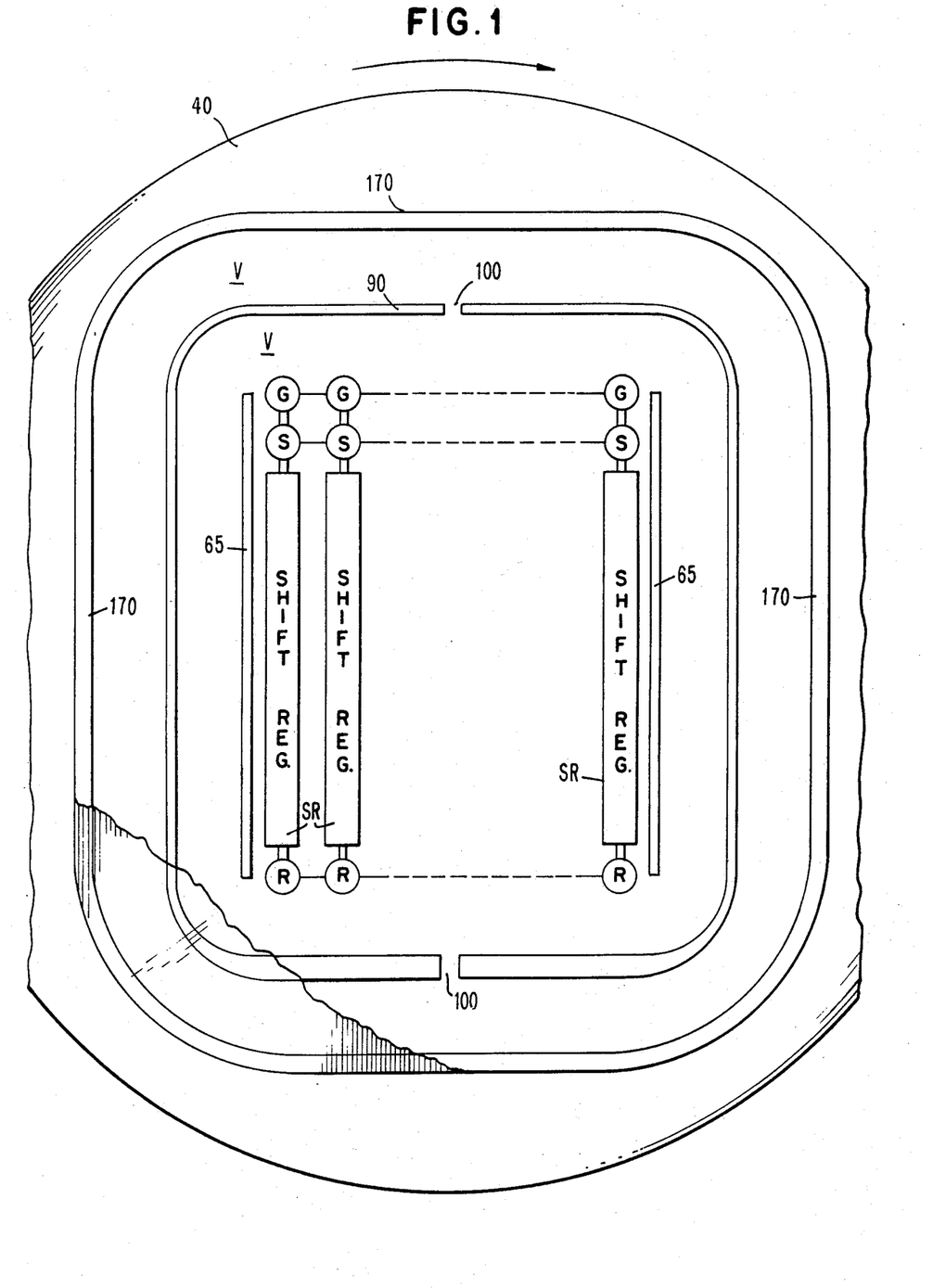
FIG. 1 is a schematic plan view of a display unit.

FIG. 1 shows a ferrofluid display system in schematic form with a set of shift registers SR shown to illustrate the type of display arrangement which can be provided by showing a fraction of the number of shift registers required for a display. The shift registers may be of several varieties, such as T- and I-bars used with garnet or amorphous bubble domain devices or those described in connection with FIGS. 2–4 herein. A reservoir V is connected to a series of bubble generators G which constantly generate bubbles at a predetermined rate which pass to bubble selector switches S, each of which can pass bubbles on to its associated register SR or back to reservoir V. The bubbles are returned to peripheral reservoir V from registers SR through return units R.

Figure 5A:
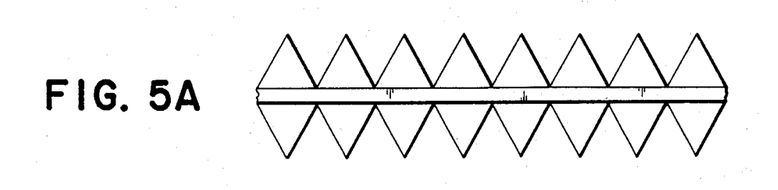
FIGS. 5A, 5B, 5C, 5D, 5E, 5F, and 5G show shift register configurations.
Figure 5B:
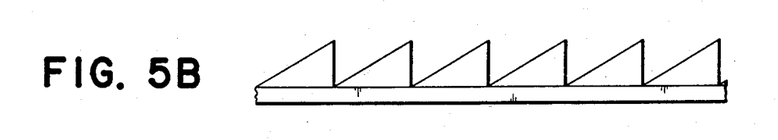
Figure 5C:
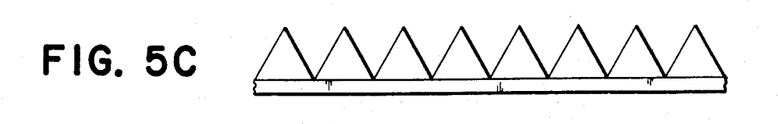
Figure 5D:
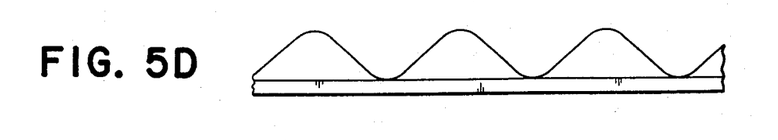
Figure 5E:
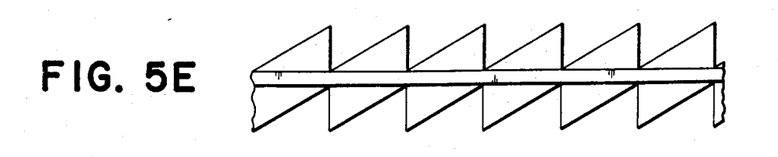
Figure 5F:
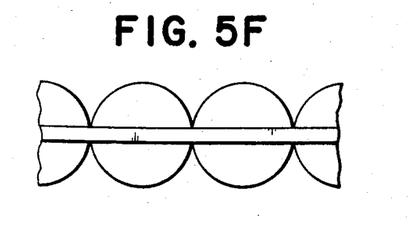
Figure 5G:
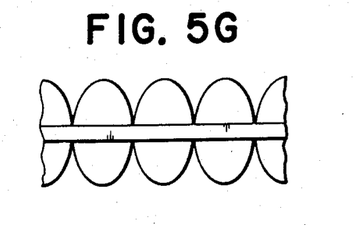

For controlling the location of the bubbles in the field, a number of permeable shift register structures can be provided such as a double saw tooth FIG. 5A, a saw tooth FIG. 5B, a triangle FIG. 5C, a sine wave, FIG. 5D, and an angle bar, FIG. 5E, series of disks FIG. 5F or a row of ellipses FIG. 5G. All are connected magnetically and physically.

In FIG. 2, a display using ferrofluid droplets to form images needs recycling of droplets back into a reservoir after the droplets' function ends. This recirculator is a magnetic nonmetering pump. The pump of FIG. 2 consists of two continuous two-sided sawtooth patterns 10 made of magnetic material and a clockwise rotating magnetic field H from magnet 40. The rotating magnetic field H can be provided by currents in an orthogonal set of coils, as is the conventional practice with magnetic bubble domains, or by physical rotation of a magnet 40 having a uniform field distribution in the active portion of the display, as shown in FIG. 3B. Since the rotating field must be stopped in order to stop translation of the image, mechanical rotation is the preferred method only for relatively slow displays. Although wetting of the pattern by ferrofluid is not essential to the operation of the recirculator, it may be preferred in some cases to have the pattern or parts thereof preferentially wetted by the ferrofluid 14.

Sawtooth recirculator patterns 10 surrounding the periphery of a device and holding ferrofluid in a host liquid between two plates 60, 61 (of which the top one 60 is transparent and forms the window of the display) recirculate, i.e., propagate the ferrofluid droplets 15 back to the top of reservoir V. By the inside and outside paths shown, they provide storage volume for the varying quantities of fluid required in the display. Apertures 100 permit passage of fluid in and out of the inside and outside of patterns 10. Sawtooth propagation patterns 16 of registers SR empty the droplets into reservoir V via return units R. The large magnetic mass (thickness [size] of the teeth) of the magnetic material of recirculator V strongly attracts the bubbles and can propagate larger droplets, resulting from the clumping of additional droplets onto an already existing one (increasing the size of the droplets already present on the magnetic pole). Another purpose of recirculator V, which is thicker near returns R for greater magnetic field is to remove stray bubbles from return units R to return them to reservoir V.

Figure 3A:
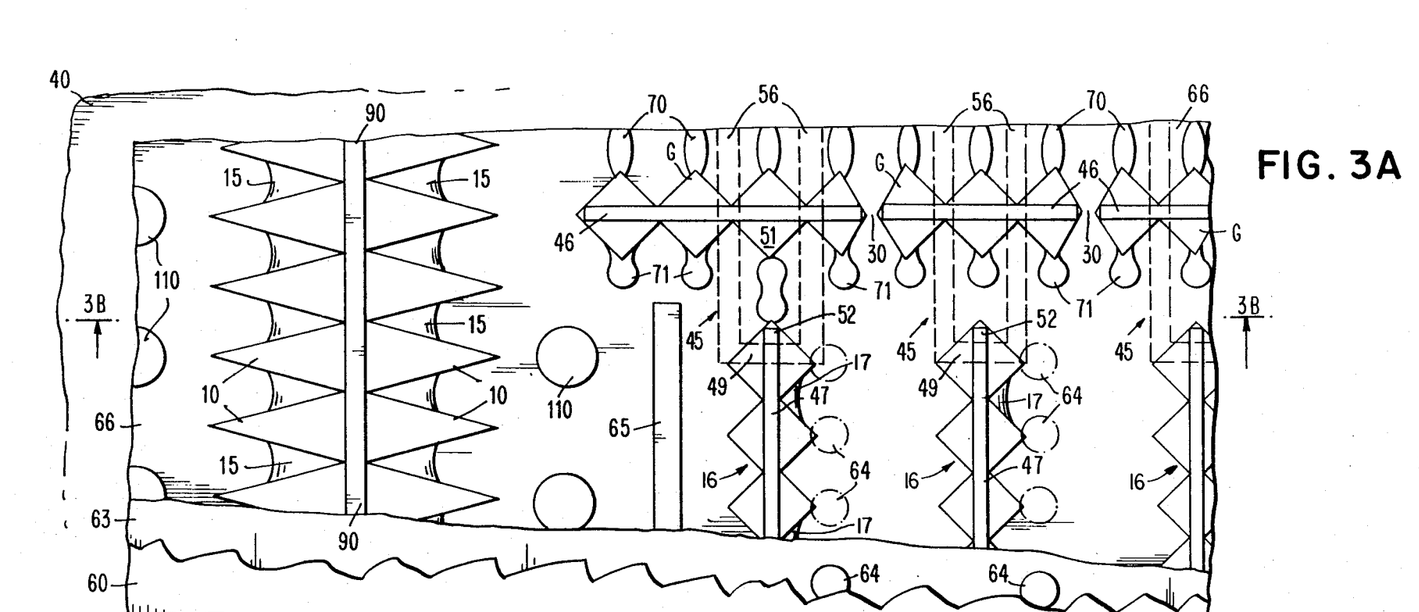
FIG. 3A is a plan view of a segment of a display unit in the upper left corner of FIG. 2 showing details of bubble generation, switching and propagation.
Figure 3B:
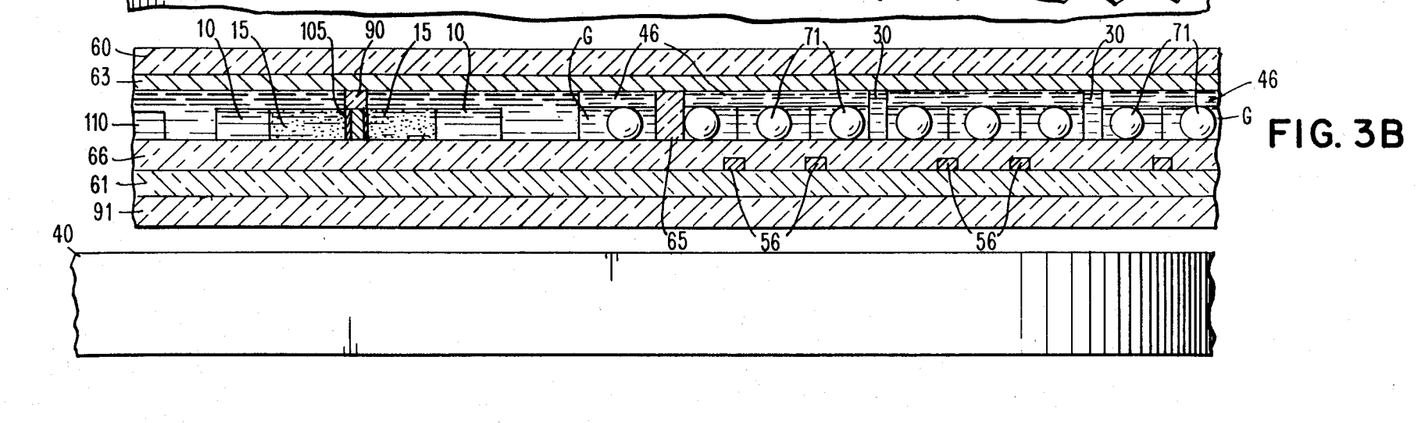
FIG. 3B is a vertical section taken along line 3B—3B in FIG. 3A.

The ferrofluid type of droplet generator G of FIGS. 3A and 3B is a magnetic structure for generating uniform size droplets of ferrofluid in an immiscible host liquid sandwiched between the two plates 60, 61. It dispenses a controlled amount of ferrofluid from a reservoir or recirculator V into position to transfer to a shift register 16 for each rotation of the magnetic field. The generator G depends on magnetic forces. The purpose here is to generate droplets of uniform size. Other alternative generators can use mechanical (displacement pump) or capillary forces to pump droplets from a source.

The ferrofluid is constantly recirculated by recirculator V in FIG. 2 and is picked up by a diamond shaped or double sawtooth pattern generators G, with a physical barrier 46 across each of these teeth, which have small gaps 30 between the diamond shaped patterns. As a constant rotating magnetic field is applied, a uniform droplet forms at gap 30 and is pulled in by the generator G. If the droplet is too large on the outside of generator G on the left hand side of gap 30, only a portion of it squeezes through gap 30 and enters the inside while the remainder of it continues along the next generator G towards the recirculator V.

Externally activated magnetic ferrofluid droplet switches 45 are shown in FIG. 3A. FIG. 3B is a cross-section of a switch 45 taken along lines 3B–3B in FIG. 3A. Generator G constantly forms ferrofluid droplets 71 which pass to tooth 51. Current in lines 56 to selector coil 49 locally increases the magnetic field gradient between teeth 51 and 52 for a short duration and thus creates a pull causing a droplet on tooth 51 to be pulled to stretch towards tooth 52 of shift register 16 and to reach tooth 52 and transfer to it in whole or in part. If a bubble does not transfer at switch 45, it continues counter-clockwise along generator G towards gap 30. At the opposite end of shift register 16, which is cut away, is return unit R to the recirculator V.

The return units R draw droplets 17 from the shift registers 16 when they reach the lower end. From these, the droplets 17 are drawn magnetically to the recirculator V after they pass through gaps 31.

On top of each permalloy generator G in the center is a glass or nonmagnetic, non-wetting physical barrier (rib) 46 extending up to nearly contact a mask 63 beneath glass 60. Such mask would consist of a thin film of opaque metal deposited on the under side of the glass 60 with apertures etched or formed otherwise at predetermined intervals. The metal layer would then be coated by $SiO_2$, glass or other metal which is preferentially wetted by the host fluid but not by the propagated fluid. Extending above the shift register 16 is a rib 47 of the same type. Rib 90 extends above pattern 10. These ribs are provided to prevent droplet bubbles from jumping across the diamond shapes to the opposite side of a diamond to lose proper position. Ribs 46, 47, and 90 can be made of a masking material such as $SiO_2$, $Al_2O_3$, glass or polytetrafluoroethylene or other impervious material such as used in making the gaskets for fabricating the display. At the bottom of each register 16 at return unit R, the rib 47 is bent to the left to block further travel of bubbles 17 so they return to the recirculator V, without climbing up the left sides of the registers 16.

Mask 63 has holes 64 through it located at selected positions where the presence of a bubble is intended to indicate certain information as shown partly in phantom in FIG. 3A. Mask 63 which can be on the bottom of plate 61 increases also the optical contrast when light is transmitted through the display from the back, by eliminating all light paths which cannot be modulated by the presence of a liquid bubble in a display pattern. A flat source of light such as an electroluminescent source 91 is positioned below plate 61 to shine through the display device.

Since the displayed image appears only at the point in the rotating field cycle when the bubble positions coincide with the hole positions, the rotating field must be stopped at the correct time in the cycle. However, in the case where the propagating bubble is transparent and nonmagnetic and the host is opaque and magnetic, mask 63 can be omitted without detriment. In this case, the image remains visible at high contrast throughout the propagation cycle.

The rotating magnet 40 is turned by a stepping motor (not shown) which is controlled by a positioning system (not shown) to stop the magnet 40 at the required angular position for display when the display data has all been entered into the display. That is, the bubbles are positioned under holes 64 when the magnet is stopped, so data can be seen from the color contrast in holes 64.

For optimum optical contrast, light is transmitted through the display. This will require a light source between the display panel and the rotating magnet 40. This can be accomplished by use of an electroluminescent panel 91, which is a very thin light source, or by deformation of the magnet structure to a bowl shape, which has essentially the same magnetic pole distribution as the disk, but with space for a conventional light source.

The edge of the display area is separated from the recirculator V by a glass or gasket rib 65 which reaches from surface material 66 up to mask 63.

Surface 66 is deposited $SiO_2$, or glass which is 0.1 to 2 times as thick as conductors 56 which are formed on glass substrate 61 by conventional techniques used in thin film technology such as evaporation and plating through resist mask; foil lamination followed by photolithography, selective etching, etc. Permalloy or other magnetic material, elements 10, 110, and 16 and G are deposited and formed on layer 66 similarly. The magnetic pattern is overcoated (sealed off) by 1.1 to 3 times its thickness of a layer 105 of $SiO_2$, glass, $Al_2O_3$, or an inert polymer which is not wetted by the propagated fluid phase.

Gasket 170 is formed outside the periphery of the permalloy recirculator pattern 10 to seal the fluids inside the display and recirculator areas. The gasket material and the ribs should be made of a material which is inert with respect to ferrofluid or the host fluid, that is it would not be swelled or otherwise chemically react with these fluids or any other constituents of the fluid. Examples of such materials are polypropylene, polyethylene, polyethylene terephthalate (mylar), polyimid, and perfluorinated or perchlorinated polymers such as VITON brand fluoroelastomers or TEFLON brand polytetrafluorethylene. The ribs 46 and 47 can be fabricated together with fabrication of the gasket and may be made of the same material. Such ribs including gasket can be made prior to assembly an integral part (by glueing) of the upper or the lower glass plate.

Alternatively to having bubbles of ferrofluid propagated in a nonmagnetic medium, bubbles of nonmagnetic fluid can be propagated in a magnetic fluid medium. These are "inverse," or transparent nonmagnetic fluid bubbles in a ferrofluid host. They propagate in the reverse direction.

The use of ferrofluids in a display media involving use of plural immiscible fluids, one of which (the ferrofluid) contains a colloidal suspension of magnetite or the like permeable material, requires the ability to move a magnetic (ferrofluid) liquid through another host fluid with as little force, and thus as little energy consumption as possible. To enable generated forces to predominate existing, interfering natural forces should be minimized. Gravity is counterbalanced by, in the case of ferrofluid, making the host fluid of the same density as the ferrofluid. Another restrictive force is the tendency of the ferrofluid to adhere to the surfaces of a containing vessel such as parallel glass plates. A bilayer, equidense, three-immiscible liquid combination is useful for horizontally oriented displays to provide an interface between two host fluids along which the ferrofluid can propagate, providing low friction bearing layers for ferrofluid bubbles.

For the three fluid case, one suitable mixture is comprised of water-base ferrofluid in a mixture of fluorocarbon FREON* TF liquid (trichlortrifluoroethane) with a density of 97.69 lbs./ft.$^3$ at 77°F and kerosene, which are miscible and higher density, higher molecular weight colorless, perfluorinated fluids such as FC-40 or FC-75** liquid with boiling points of 320°F and 216°F, respectively, and density at 77°F of 117 lbs./ft.$^3$ and 110 lbs./ft.$^3$. Any combination of hydrophobic liquids able to form two immiscible layers, one denser and one less dense than the ferrofluid, can be used. The total combination must not flocculate the ferrofluid.

In the three fluid case the FREON* TF fluorocarbon liquid and kerosene mixture forms the upper host fluid layer and FREON* fluorocarbon liquid and FC-40 or FC-75** liquid mixture forms the lower host fluid layer. By dissolving just the right amount of kerosene and FREON* TF liquid in the upper layer, its density is adjusted to just below that of the ferrofluid. Thus, the ferrofluid will sink with the minimal amount of gravitational force and rest on the frictionless surface of the lower host fluid layer.

*A registered trademark of DuPont
**"Fluoinert" products of the 3M Company

In general, a system or a display employing ferrofluid droplets requires the confining of excess fluid to a restricted area, from which the fluid is removed as required to form new droplets. Since the ferrofluid droplets, unlike magnetic bubble domains, are magnetic fluid droplets in a nonmagnetic host having volume and mass, they cannot collapse (be annihilated) or be generated (created) but must, by manipulating the magnetic field, be formed by drawing from a reservoir (a body of magnetic fluid) and be returned to same when its immediate usefulness has expired. Design of a ferrofluid reservoir used in construction of a display must take into account (a) gravity force, (b) surface tension and capillary forces and, (c) magnetic (attraction) forces.

Specific gravity of the host solution can be matched to that of the ferrofluid (which is a desirable case because the display can then operate in either vertical or horizontal position) so the forces involved are primarily (b) and (c). Thus, the reservoir V is a ferrofluid droplet "concentrator" in which the concentration is accomplished using magnetic and capillary forces. The magnetic force can be externally applied using an electromagnet or using a permanent magnet as here to magnetize the permalloy recirculator pattern 10.

The rotating permanent magnet 40 is present for propagation purposes. It is therefore available to enable recirculation, as well, so the capillary forces need not be dominating (very large). The concentration of droplets and holding of the body of the fluid results from the magnetic field gradient near the magnetized permalloy pattern 10. Magnetic disks 110 placed around the periphery of the display store a certain amount of magnetic fluid which rotates constantly around the periphery of each disk. When this amount exceeds a certain value and the recirculator V contains very little fluid, the excess fluid leaves the disks and fills the recirculator V, thus constantly providing ample fluid to the generators.

Alternatively, if an electromagnet is used to concentrate the droplets, there should be large capillary forces due to surface coatings within the reservoir for the ferrofluid to remain in place when the display is moved or shaken while the electrical current to the electromagnet is shut off. Since, from the point of view of ease of formation of droplets, it is desired not to have excessively large capillary forces acting on the ferrofluid, the permanent magnet case in connection with barriers 65 and medium-to-weak capillary forces acting together are the preferred embodiment.

Figure 4A:
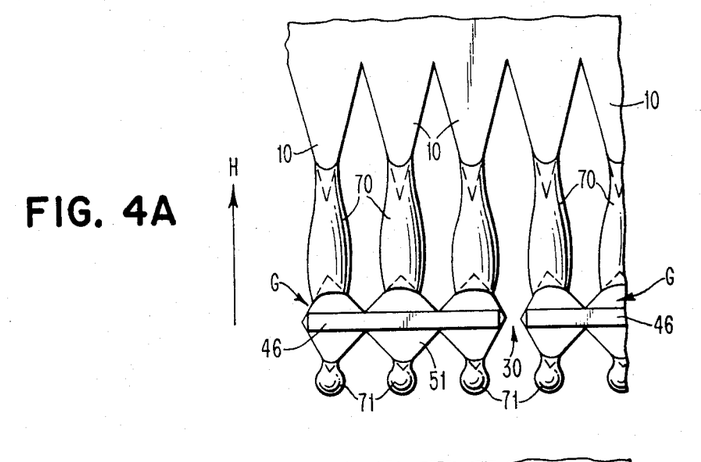
FIGS. 4A, 4B, and 4C show ferrofluid display material stretching between reservoir teeth and generator teeth for three different orientations of the rotating magnetic field.

FIG. 4A shows a set of recirculator teeth 10 juxtaposed with the teeth of generator G with the magnetic field vertical and aligned with the points of the teeth so that the magnetic field is aligned with the teeth 10 and the diamonds of generator G. Thus, the ferrofluid forms drops 70 between the generator G and teeth 10, with bubbles 71 formed on the opposite teeth of the generator G. When the field rotates clockwise, the magnetic poles induced in the permalloy patterns shift away from the tips of the teeth. When it is rotated clockwise from the orientation of FIG. 4A, the magnetic poles shift to the left on the teeth of the recirculator 10 and to the right on the upper teeth of the generator G. This produces a counterclockwise shearing of the ferrofluid droplets 70 until at some field orientation they abruptly tear apart. If sufficient fluid is available, they may rejoin in a new bridging arrangement as in FIG. 4B, or they may remain disconnected. In either case, when the field has rotated 90° to the horizontal position, FIG. 4C, the large spaces between teeth 10 are filled with the drops which have moved to the left, in general, and the valleys 73 of the generator are filled with bubbles that have moved to the right or counterclockwise, in the opposite direction of motion from the magnetic field. Some bubbles 74 have moved into the gaps 30, ready to transfer to the lower surfaces of the generators G.

Figure 4B:
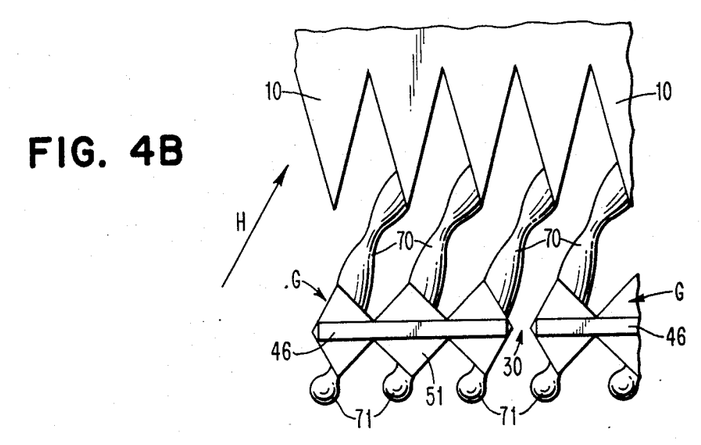
Figure 4C:
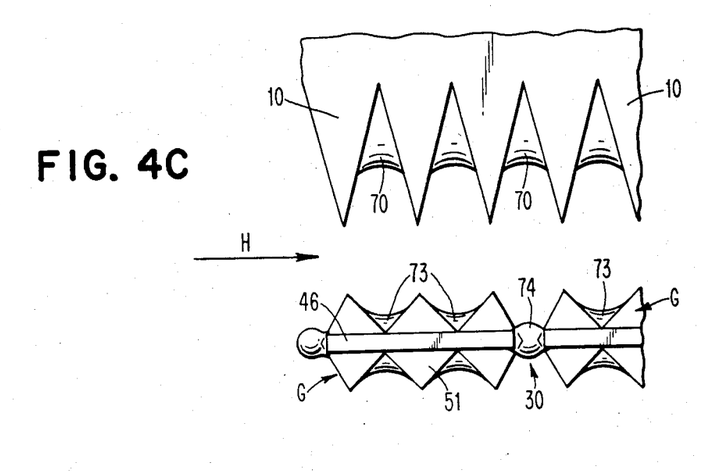

The motions in FIGS. 4A–4C are duplicated in general by all the permalloy sawtooth and diamond shaped patterns shown in FIG. 5 to provide incremental motion of the bubbles for each rotation of the field. Thus, the data is constantly being scrolled down the display as the field rotates and will be visible when the bubbles are in position to show through the holes in mask 63.

Figure 6A:
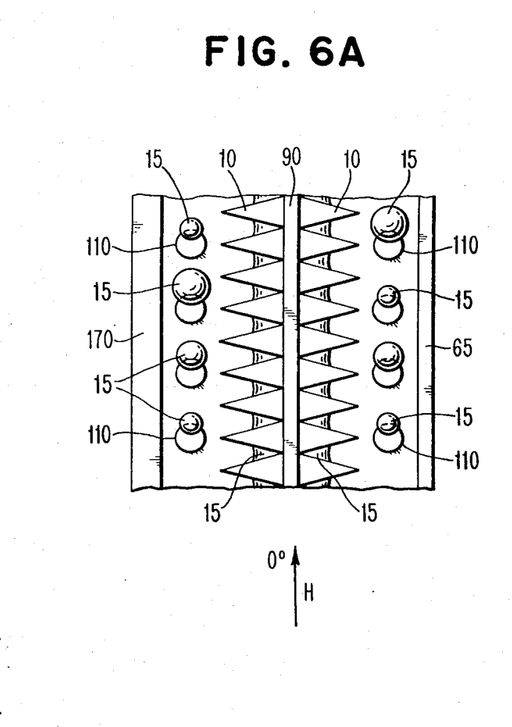
FIGS. 6A, 6B, and 6C show bubbles rotating about magnetic disks in the reservoir.
Figure 6B:
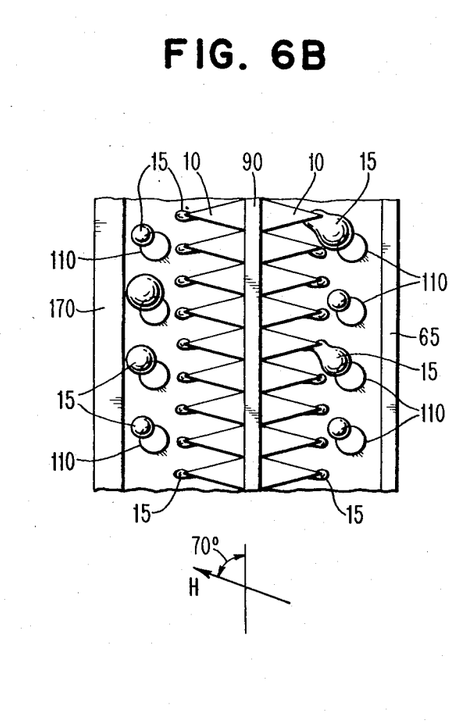
Figure 6C:
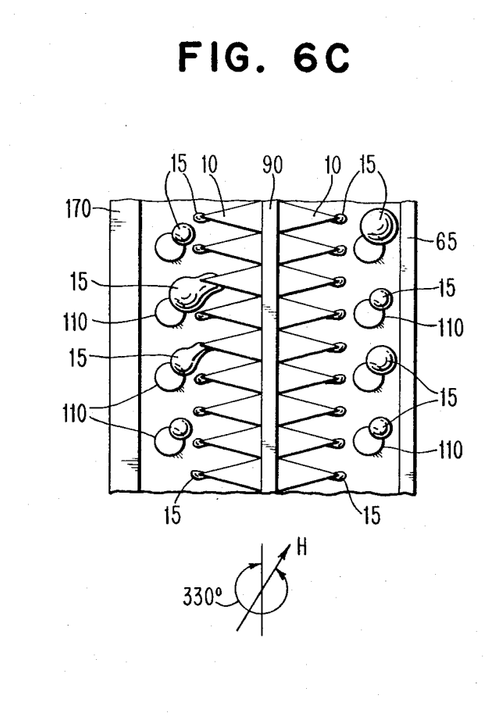

FIGS. 6A, 6B and 6C show the position of the ferrofluid in recirculator V as the field is rotated counterclockwise (which is also satisfactory since bubbles can travel in both directions although in this embodiment the clockwise direction is employed) from 0° through 70° to 330° from the starting point. In addition to storing the excess fluid, the disks perform the function of homogenizing the droplet bubble size and regulating (making more uniform) the volume of the recirculated fluid.

What is claimed is:
1. A display comprising
a first fluid and a second fluid substantially immiscible with said first fluid, said first fluid carrying a plurality of magnetic particles, means for emitting separate droplets of one of said fluids from a first space into a second space,
means for providing a rotating magnetic field,
magnetic means for propagating incremental step-by-step motion of said droplets from said means for emitting along a predetermined path in said second space, said magnetic means cooperating with said rotating magnetic field to provide one incremental step of motion for each rotation of said magnetic field.

2. Apparatus in accordance with claim 1 including a third fluid substantially immiscible with said first and second fluids,
said one of said first and second fluids having droplets emitted being suspended in the remaining ones of said three fluids.

3. Apparatus in accordance with claim 1 wherein said magnetic means comprises a pattern of magnetizable shapes having a modulated configuration of narrow and wide segments, providing peaks and valleys whereby droplets are propagated along a path in said rotating magnetic field.

4. Apparatus in accordance with claim 1 including recirculator means for carrying droplets from said magnetic means to said means for emitting.

5. Apparatus in accordance with claim 4 wherein said means for recirculating includes storage structures for holding excess droplets.

6. Apparatus in accordance with claim 1 wherein a mask with a plurality of apertures is provided, said magnetic means being adapted to move said droplets along a path crossing into alignment with said apertures, and a source of illumination behind said display, whereby said droplets modulate light transmitted through said display.

7. Apparatus in accordance with claim 1 including switching means for selecting droplets for passage from said means for emitting into said second space in response to a predetermined condition signal and passage elsewhere in the absence of said predetermined condition of a control signal.

8. A display apparatus employing fluid droplets to represent data including a carrier fluid and a magnetic fluid, said fluids possessing contrasting optical properties, said fluids being immiscible.
one of said fluids including magnetic particles, such that droplets of one fluid within the other fluid can be translated in response to a magnetic field,
an array of display rows, a reservoir of one of said fluids, an array of means for emitting droplets of said one fluid from said reservoir into proximity to an associated one of said display rows,
each display row including a magnetic structure for providing a propagation path for a plurality of emitted droplets and means for providing a rotating magnetic field for magnetizing said magnetic structure to produce droplet translation on a step-by-step basis with each rotation of said magnetic field.

9. Apparatus in accordance with claim 8 including switching means for selecting droplets for passage from said means for emitting to one of said display rows in response to a predetermined condition signal and passage elsewhere in the absence of said predetermined condition of a control signal.

* * * * *